United States Patent [19]

Le Creff

[11] Patent Number: 4,990,971
[45] Date of Patent: Feb. 5, 1991

[54] LIGHT EMITTING DIODE NETWORK

[75] Inventor: René Le Creff, Sens, France

[73] Assignee: Valeo Vision, Cedex, France

[21] Appl. No.: 404,450

[22] Filed: Sep. 8, 1989

[30] Foreign Application Priority Data

Sep. 23, 1988 [FR] France ................. 88 12436

[51] Int. Cl.⁵ ............................................. H01L 33/00
[52] U.S. Cl. ......................................... 357/17; 357/75;
357/68; 362/800; 362/240
[58] Field of Search ..................... 357/17, 75, 68;
362/800, 240, 247; 340/753

[56] References Cited

U.S. PATENT DOCUMENTS

| 4,439,818 | 3/1984 | Scheib | 352/800 |
| 4,471,415 | 9/1984 | Larson et al. | 352/800 |
| 4,628,422 | 12/1986 | Ewald | 362/240 |
| 4,742,432 | 5/1988 | Thillays et al. | 361/400 |

FOREIGN PATENT DOCUMENTS

| 0917812 | 12/1972 | Canada | 357/17 |
| 0088060 | 9/1983 | European Pat. Off. | |
| 2518317 | 6/1983 | France | |
| 57-193079 | 11/1982 | Japan | 357/17 |
| 58-199576 | 11/1983 | Japan | 357/17 |
| 61-198690 | 9/1986 | Japan | 357/17 |

Primary Examiner—Rolf Hille
Assistant Examiner—Minh Loan Tran
Attorney, Agent, or Firm—Wenderoth, Lind & Ponack

[57] ABSTRACT

A light emitting diode network includes a plurality of light emitting diodes arranged in a row. Each of the plurality of light emitting diodes includes a semiconductor crystal having first and second regions of opposed conductivity types respectively facing opposite sides of the row. First and second electric conductors are provided for respectively connecting the first regions of the diodes together and the second regions of the diodes together. Each of the first and second electrical inductors having alternating first and second flat portions in which the first flat portions are perpendicular relative the second flat portions. The first flat portions are soldered to the semiconductor crystals, and the second flat portions function as cooling fins for the light emitting diode network.

20 Claims, 1 Drawing Sheet

LIGHT EMITING DIODE NETWORK

FIELD OF THE INVENTION

This invention relates to a network of light emitting diodes comprising a plurality of semi-conductor crystals, each of which has two regions of opposed conductivity types, a p-type region and an n-type region respectively, the regions being respectively and selectively in contact with connecting elements.

BACKGROUND OF THE INVENTION

Such networks are now being used to an increasing extent, for example, as a replacement for incandescent or fluorescent lamps in lighting equipment for automotive vehicles. Similarly they are being increasingly used for indicator lamps, e.g. for signalling the operation of the brake lights, direction indicators, and safety indicating devices.

The light emitting diode networks often used in practice have semi-conductor crystals arranged on electrical connectors, formed in a predetermined configuration on an insulating support element and arranged to provide the electrical supply for the diodes. Each electrical connector is respectively, and selectively, in contact with the p-type and n-type regions of the semi-conductor light emitting crystals constituting the network. This assembly is designed for a method of mounting the electronic components on large surfaces, that is to say a modular assembly, with regular spacing, adapted for direct soldering of the p-type anode-base of the semi-conductor crystals, using conductive resins which only polymerise at temperatures of the order of 200° C. More particularly, they are adapted for soldering of gold wire for connecting the n-type cathode, which provides the other electrical contact zone of each crystal. This method of assembly is poorly adapted for use with those printed circuits that are designed for the mounting of electronic components where the latter have previously been deposited and welded in a vacuum at relatively low temperatures, or with other networks in which the connections are carried on the insulating supports of plastics materials, which would be liable to be degraded by the temperatures necessary for the soldering of the light emitting crystals.

In addition, in most known applications, the electro-luminescent elements, which generally form a matrix of light emitting diodes, have to be arranged in large numbers on a small surface, and the emission of light beams from each of them must be localised into a zone which is substantially a point. The luminous intensity of the beams is then reinforced subsequently, using an appropriate optical system.

French published patent specification No. FR 2 574 616 A discloses such an optical system, in which the assembly comprising a plurality of light emitting diodes, whether or not carried by a specific support inserted on an insulating substrate, together with a system of optical collimating elements, has to respond to a predetermined directionality of the light beam. The collimating elements should preferably constitute an array of parabolic reflectors, each one being on substantially the same optical axis as the corresponding semi-conductor crystal.

Furthermore, in spite of the low current consumption of the electro-luminescent elements, the fact that they are concentrated on the insulating support matrix on which they are carried leads to thermal problems, which also produce side effects in regard to luminous efficiency. As an example, an increase in the temperature of the assembly due to the power dissipated by 50 diodes (of the order of 4 watts) would lead to a reduction in light output which may be as much as 0.7% per degree C. Such an increase in temperature may also lead, in certain cases, or with certain arrangements, to deterioration of the greater part of the materials, such as plastics materials, which generally constitute the reflector or its possible coating layers, the latter being deposited by a metallisation procedure in a vacuum, followed by application of a protective varnish.

In the published French patent application No. FR 2 565 726 A, it has been proposed that light emitting diodes should be fixed on a first metallic band which constitutes an electrical connector of a first polarity, while a second metallic band, constituting an electrical sector of a second polarity, is connected to each of the light emitting diodes by a connecting wire. However, such an arrangement does not allow for sufficiently good removal of the heat which is produced in operation, and it is also somewhat fragile because of the presence of the connecting wires, which may be ruptured or become disconnected under the influence of heating and vibrations which are inherent in use during an automotive vehicle.

SUMMARY OF THE INVENTION

An object of the present invention is accordingly to remedy the disadvantages described above. According to the invention, there is provided a light emitting diode network comprising a plurality of semi-conductor crystals which each comprises p-type and n-type regions of opposed conductivity types defining an electro-luminescent junction and connecting elements, each of which is in contact selectively with a respective one of the p-type and n-type regions. The network comprises at least one band of light emitting diodes which is essentially a plurality of semi-conductor crystals, arranged one behind the other and between the connecting elements. The connecting element are two connecting strips, one of which is in contact with the p-type regions and the other of which is in contact with the n-type regions of the semi-conductor crystals.

The connecting strips are preferably formed from a wire made from a good electrically conducting material which is also a very good thermal conductor, for example cooper, aluminium, brass or zinc. Each connecting strip is so shaped as to define a succession of two series of alternate flat sectors, with the sectors of the first of these series perpendicular to those of the second series.

The flat sectors of the said first series are preferably oriented parallel to the contact regions of each of the semi-conductor crystals, so that they can be assembled with the latter by direct soldering. The flat sectors of one of the said series preferably act as cooling fins for dissipating the heat produced in operation; While the flat sectors of the other series, disposed perpendicularly between the flat sectors of the first series, extend outwardly of the lateral sides of the band of light emitting diodes.

Other features and advantages of the invention will appear more clearly from the detailed description which follows, of a preferred embodiment of the invention shown in the accompanying drawings.

DESCRIPTION OF PREFERRED EMBODIMENT

Figure 1:
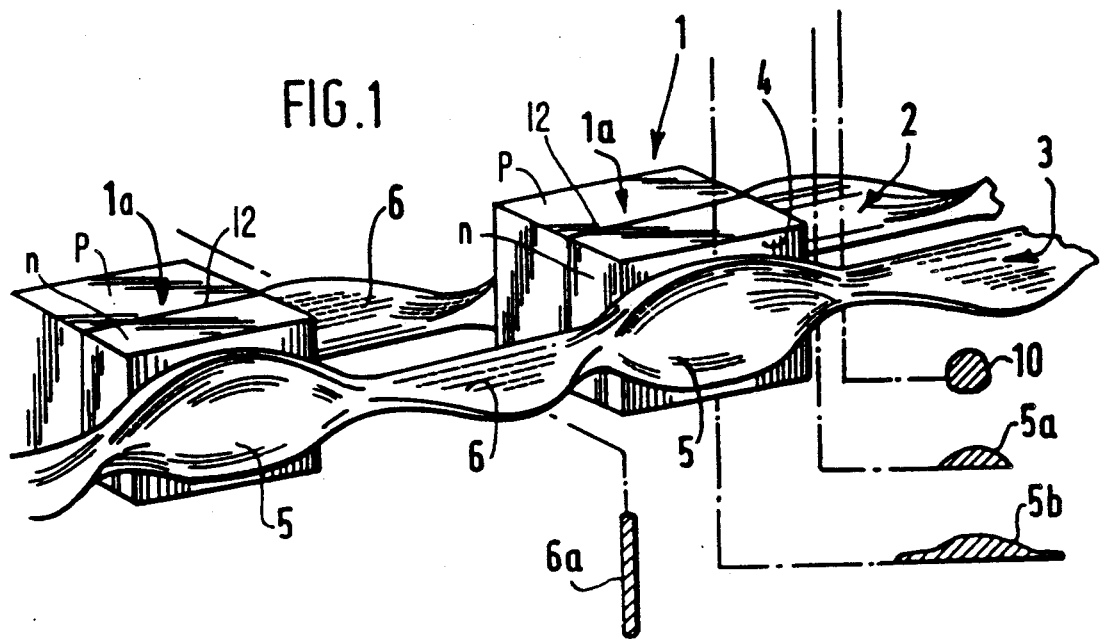
FIG. 1 shows a perspective and on a large scale a portion of a band of light emitting diodes in accordance with the invention.

In accordance with the invention, the light emitting diode band 1 comprises a plurality of semi-conductor crystals 1a, which are preferably cubic in shape and which are arranged one behind the other at equal spacing between two metallic connecting strips 2 and 3. Each crystal 1a contains, in a known manner, at least two regions N, P of opposite conductivity types, forming an electro-luminescent junction 12.

Each of the connecting strips 2, 3 is formed from a wire, made of a material having good electrical conductivity and very good thermal conductivity. This wire is shaped in such a way as to define a succession of two alternating series of flat sectors 5 and 6, in which the sectors 5 of the first series are perpendicular to the sectors 6 of the second series. The flat sectors 5 of the first series are oriented parallel to the contact region 4 of each crystal 1a, so as to be able to be assembled with the latter by direct soldering, using conductive resins having a high polymerisation temperature.

The sectors 6 of the second series are arranged perpendicularly between the sectors 5 of the first series, and in the region lying between the semi-conductor crystals 1a. The sectors 6 extend outwardly with respect to the lateral sides of the light emitting diode band 1. The various cross sections obtained after forming the round wire 10 are indicated in FIG. 1 at 10 5a, 5b and 6a.

The sectors 6 give rise to a succession of metallic areas of contact which constitute the external connecting elements themselves of the semi-conductor crystals 1a, with these external connecting elements being insulated from each other. The sectors 6 also serve as radiating elements in the form of cooling fins, for removing the heat dissipated by the two opposed regions of the electro-luminescent junction of the semi-conductor cystals 1a.

The wire from which the two connecting strips 2 and 3 are formed may be of copper, aluminium, brass or zinc. These materials are most appropriate for the elements for radiating heat from the electro-luminescent materials, without the requiring recourse to gold or silver plating.

This embodiment of a band of diodes 1, in which the substantially cubic crystals 1a emit light in a substantially planar beam, has numerous advantages, due particulary to its special shape, the choice of materials and methods of assembly used, and the simplicity of the arrangement generally, which permits easy automation.

Because the crystals 1a are arranged in a series in a band in association with each other and equally spaced apart, between two elongate connecting strips 2 and 3 which also include heat radiating elements and the direct electrical connections through the sectors 5 and 6, these connections being of course required for each of the two contact regions of the p-n junctions, both the assembly, operation and attachment to any insulating support carrying the optical element or elements (such as parabolic reflectors 7) are facilitated. In this way, the insulating support does not call for the use of a material having properties of high heat dissipation, which could be inconvenient.

Figure 2:
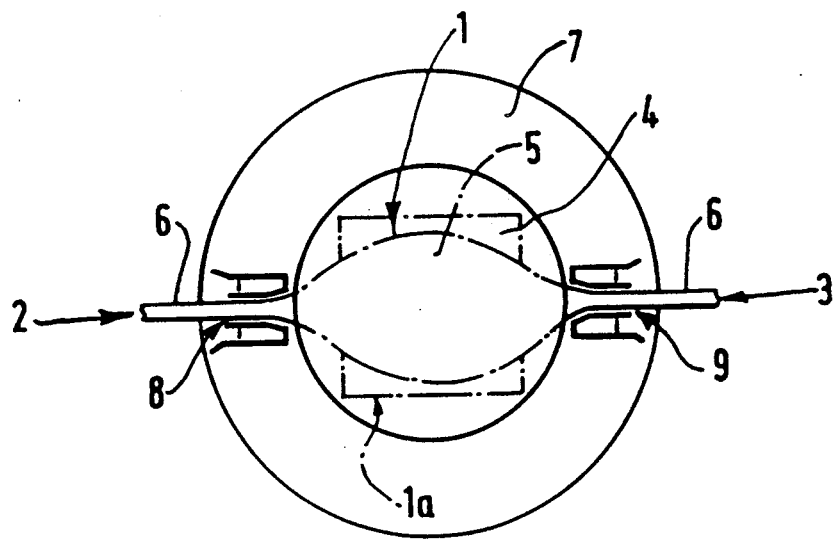
FIG. 2 shows one of the light emitting diodes in the band shown in FIG. 1, mounted by means of its cooling fins on an optical collimating element.

In FIG. 2, by way of non-limiting example, one of the elementrary diodes 1 is shown positioned in the base of an elementary reflector 7 which is provided for this purpose with grooves 8 and 9, in which the electrical contact regions of the sectors 6 of one of the connecting strips 2, 3 are inserted selectively and directly. The semi-conductor crystals 1a are thus assembled precisely in place at the, focus point of the reflector 7, which is thus enabled to transmit to the best advantage from its focal centre all the light emitted in the flat beam of the semi-conductor crystal 1.

It is possible to produce bands of diodes 1 which are relatively long, and then to cut them to a desired length and arrange them in juxtaposition with each other by interconnecting them in series and/or in parallel.

What is claimed is:

1. A light emitting diode network comprising:

A plurality of light emitting dioses arranged in a row, each of the plurality of light emitting diodes comprising a semiconductor crystal having first and second regions of first and second conductivity types respectively, said first and second regions defining an electroluminescent junction therebetweem, a surface of said first region of said semiconductor crystal of each of said pluralitry of light emitting dioses facing outwardly relative to a first side of the row, a surface of said second region of said semiconductor crystal of each of said plurality of light emitting diodes facing outwardly relative to a second side of the row opposite the first side of the row; and, first and second electrical conductors respectively connecting said first regions of said plurality of diodes together and said second regions of said plurality of diodes together, each of said first and second electrical conductors having alternating first and second flat portions, each of said first flat portions extending at an angle relative to each of said second flat portions.

2. A light emitting diode network as recited in claim 1, wherein each of said first flat portions is perpendicular relative to each of said second flat portions.

3. A light emitting diode network as recited in claim 2, said first and second electrical conductors being comprised on one of copper, aluminum, brass, zinc and other metallic materials having a relatively high thermal conductivity.

4. A light emitting diode network as recited in claim 2, said surface of said first region of each of said plurality of light emitting diodes being parallel to and connected to one of said first flat portions of said first electrical conductor, said surface of said second region of each of said plurality of light emitting diodes being parallel to and connected to one of said first flat portions of said second electrical conductor.

5. A light emitting diode network as recited in claim 4, said surface of said first region of each of said plurality of light emitting diodes being direct soldered to one of said first flat portions of said first electrical conductor, said surface of said second region of each of said plurality of light emitting diodes being direct soldered to one of said first flat portions of said second electrical conductors.

6. A light emitting diode network as recited in claim 5, said second flat portions of said first and second electrical conductors functioning as cooling fins and extending outwardly from the row relative said surfaces of said first and second regions respectively.

7. A light emitting diode network as recited in claim 6, each of the light emitting diodes being spaced equidistant along the row.

8. A light emitting diode network as recited in claim 7, at least one of said plurality of light emitting diodes further comprising a reflector defining a focus point, said reflector comprising grooves for engaging said second flat portions of said first and second electrical conductors on opposite sides of said at least one of said plurality of light emitting diodes so as to position said focus point relative said at least one of said plurality of light emitting diodes.

9. A light emitting diode network as recitred in claim 5, each of the light emitting diodes being spaced equidistant along the row.

10. A light emitting diode network as recited in claim 4, said second flat portions of said first and second electrical conductors functioning as cooling fins and extending outwardly from the row relative said surfaces of said first and second regions respectively.

11. A light emitting diode network as recited in claim 10, each of the light emitting diodes being spaced equidistant along the row.

12. A light emitting diode network as recited in claim 4, each of the light emitting diodes being spaced equidistant along the row.

13. A light emitting diode network as recited in claim 2, said surface of said first region of each of said plurality of light emitting diodes being direct soldered to one of said first flat portions of said first electrical conductor, said surface of said second region of each of said plurality of light emitting diodes being direct soldered to one of said first flat portions of said second electrical conductors.

14. A light emitting diode network as recited in claim 13, said second flat portions of said first and second electrical conductors functioning as cooling fins and extending outwardly from the row relative said surfaces of said first and second regions respectively.

15. A light emitting diode network as recited in claim 14, each of the light emitting diodes being spaced equidistant along the row.

16. A light emitting diode network as recited in claim 13, each of the light emitting diodes being spaced equidistant along the row.

17. A light emitting diode network as recited in claim 2, said second flat portions of said first and second electrical conductors functioning as cooling fins and extending outwardly from the row relative said surfaces of said first and second regions respectively.

18. A light emitting diode network as recited in claim 17, each of the light emitting diodes being spaced equidistant along the row.

19. A light emitting diode network as recited in claim 2, each of the light emitting diodes being spaced equidistant along the row.

20. A light emitting diode network as recited in claim 2, at least one of said plurality of light emitting diodes further comprising a reflector defining a focus point, said reflector comprising grooves for engaging said second flat portions of said first and second electrical conductors on opposite sides of said at least one of said plurality of light emitting diodes so as to position said focus point relative said at least one of said plurality of light emitting diodes.

* * * * *